United States Patent
Burkard (10) Patent No.: US 11,936,159 B2
(45) Date of Patent: Mar. 19, 2024

(54) INTEGRATED LASER DRIVER CIRCUIT FOR SWITCHING A PULSE CURRENT FOR A LASER DIODE

(71) Applicant: IC-HAUS GMBH, Bodenheim (DE)

(72) Inventor: Ralf Burkard, Kemel (DE)

(73) Assignee: IC-HAUS GMBH, Bodenheim (DE)

( * ) Notice: Subject to any disclaimer, the term of this patent is extended or adjusted under 35 U.S.C. 154(b) by 809 days.

(21) Appl. No.: 16/648,363

(22) PCT Filed: Sep. 4, 2018

(86) PCT No.: PCT/DE2018/100750
§ 371 (c)(1),
(2) Date: Mar. 18, 2020

(87) PCT Pub. No.: WO2019/057236
PCT Pub. Date: Mar. 28, 2019

(65) Prior Publication Data
US 2020/0227889 A1     Jul. 16, 2020

(30) Foreign Application Priority Data
Sep. 19, 2017   (DE) ..................... 10 2017 121 713.4

(51) Int. Cl.
*H01S 5/042*     (2006.01)
*H01S 3/10*      (2006.01)
(Continued)

(52) U.S. Cl.
CPC ........ *H01S 5/0428* (2013.01); *H01S 5/06216* (2013.01); *H03K 17/6871* (2013.01);
(Continued)

(58) Field of Classification Search
CPC ............... H01S 5/0428; H01S 5/06216; H01S 3/10046; H01S 5/0261; H01S 5/06226;
(Continued)

(56) References Cited

U.S. PATENT DOCUMENTS 6,618,406 B1    9/2003  Kaminishi
2021/0028592 A1*  1/2021  Zhuo ................. H03K 17/04106
2022/0069545 A1*  3/2022  Venkataraman ... H03K 17/6871

FOREIGN PATENT DOCUMENTS

DE      102009060873 A1    7/2011
JP        H1065239 A       3/1998

OTHER PUBLICATIONS

Translation of '873 (Year: 2011).*
(Continued)

*Primary Examiner* — M. A. Golub-Miller
(74) *Attorney, Agent, or Firm* — Thompson Hine LLP (57) ABSTRACT

Various implementations disclosed herein relate to an integrated laser driver circuit for switching a pulse current ($I_P$) for a laser diode having a plurality of sub-switching units for generating in each case a partial current ($I_T$) using a switch for pulsing the partial current ($I_T$), wherein the sub-switching units are connected to one another in parallel for generating the pulse current ($I_P$), wherein an energy accumulator is integrated into each of the sub-switching units to provide the switching energy required for switching the switch. The disclosure further relates to a laser system having a laser diode and an integrated laser driver circuit.

17 Claims, 2 Drawing Sheets

(51) Int. Cl.
H01S 5/062 (2006.01)
H03K 17/687 (2006.01)
H01S 5/026 (2006.01)

(52) U.S. Cl.
CPC ......... *H01S 3/10046* (2013.01); *H01S 5/0261* (2013.01); *H01S 5/06226* (2013.01); *H03K 2217/0063* (2013.01); *H03K 2217/0072* (2013.01)

(58) Field of Classification Search
CPC ....... H03K 17/6871; H03K 2217/0063; H03K 2217/0072
See application file for complete search history.

(56) References Cited

OTHER PUBLICATIONS

PCT, European Patent Office (ISA/EP), International Search Report (with English Translation), International Application No. PCT/DE2018/100750, 5 pages, dated Dec. 13, 2018.
Chinese Patent Office, Chinese Office Action dated Jan. 12, 2023 which pertains to Chinese Patent Application No. 2018800608085. 7 pages.
European Patent Office, EP Office Action Article 94(3) dated Dec. 6, 2022 which pertains to European Patent Application No. 18785494. 8. 9 pages.
PCT, The International Bureau of WIPO, International Preliminary Report on Patentability (English Translation), International Application No. PCT/DE2018/100750, 7 pages, dated Apr. 2, 2020.

* cited by examiner

INTEGRATED LASER DRIVER CIRCUIT FOR SWITCHING A PULSE CURRENT FOR A LASER DIODE

TECHNICAL FIELD

The present disclosure relates to an integrated laser driver circuit for switching a pulse current for a laser diode.

BACKGROUND

Integrated laser driver circuits are used in many fields of technology for switching high currents, in particular high pulse currents, for applications using one or more laser diodes. Corresponding laser systems can thus be used in time-of-flight applications, in safety technology, but also, for example, in automotive technology, for example, in conjunction with LIDAR sensors (light detection and ranging). It is necessary for currents to be switched reliably and rapidly for the use in corresponding applications.

An integrated laser driver circuit for switching a pulse current for a laser diode is known, for example, from DE 10 2009 060 873 A1. The laser driver circuit includes a plurality of sub-switching units, which are each provided for generating a partial current, wherein each sub-switching unit includes a switch, using which the partial current can be pulsed. The sub-switching units are in turn connected in parallel to one another, so that the partial currents of the sub-switching units may add up to a total pulse current.

Such integrated laser driver circuits have certainly proven themselves in practice, but these circuits, in particular in high current applications having very high currents in the ampere range, reach their limits due to different switching points in time of the sub-switching units, so that in particular the required switching times and pulse forms can no longer be implemented.

SUMMARY

The present disclosure relates to an integrated laser driver circuit for switching a pulse current for a laser diode having a plurality of sub-switching units for generating in each case a partial current using a switch for pulsing the partial current, wherein the sub-switching units are connected to one another in parallel for generating the pulse current. The disclosure furthermore relates to a laser system having at least one laser diode and at least one integrated laser driver circuit.

This disclosure has the object of specifying an integrated laser driver circuit, by means of which even very high pulse currents can be switched in a very short time.

This object is achieved in an integrated laser driver circuit of the type mentioned at the outset in that an energy accumulator for providing the switching energy required for switching the switch is integrated into each of the sub-switching units.

With the aid of an energy accumulator inside the sub-switching unit, it is possible to switch even high pulse currents per sub-switching unit, in particular in the ampere range, for example, in the range of 1-10 A, uniformly and rapidly in the group of the sub-switching units. The switching energy required for switching the switch can be reserved in this manner inside the sub-switching units and can be provided directly. In this manner, a collapse of the local supply voltage can be prevented and it can thus be stabilized. The energy accumulator can then act as a voltage and/or power source in the event of a high current or power demand, as occurs during the switching procedure. In addition, mutual influencing of the individual sub-switching units can be prevented, whereby a more uniform switching procedure may be produced. In particular, pulses having high flank steepness can be generated. One preferred design provides that each sub-switching unit includes a supply terminal for applying a supply voltage and a ground terminal, wherein the energy accumulator is connected between the supply terminal and the ground terminal. The supply voltage can be stabilized, in particular during the switching procedure, by an interconnection of the energy accumulator between the supply terminal and the ground terminal. The energy accumulator can preferably be connected in parallel to the supply voltage, so that the energy accumulator can act if needed as a supporting voltage and/or energy source. Current spikes can be reliably balanced out in this manner and the switching energy required for changing over the switch can be locally provided.

In a design aspect, it is proposed that the energy accumulator be designed as at least one capacitor, which particularly preferably has a low impedance. In addition, interfering time-limited overvoltages can be absorbed and the propagation and harmful effect thereof can thus be reduced. It is particularly preferable if the capacitor has a capacitance in the nanofarad range or in the picofarad range, but particularly preferably in the picofarad range. To avoid parasitic effects, it has furthermore proven to be advantageous if the energy accumulator is connected via a short and low-inductance connector. The energy accumulator can be connected in a low-inductance manner by lines which are correspondingly formed short and/or by cross sections of the conductor tracks which are selected to be large. Due to the spatial proximity to the respective switch, inductances are minimized, because of which the required switching current for switching on the switch can be supplied immediately and voltage drops can thus be kept within limits. Simultaneously, the high currents can only flow on the short path, so that the EMC interferences thus induced can be strongly damped. Instabilities and a variation of the integrated laser driver circuit can be prevented in this way.

According to one constructive design, it is provided that the capacitor is designed as a metal-insulator-metal (MIM) capacitor and/or as a fringe capacitor and/or as a poly-poly capacitor and/or as a diffusion capacitor and/or as a gate capacitor. It has proven to be advantageous if capacitors which are designed to be low resistance are used as energy accumulators. In this manner, a high capacitance per unit of length can be achieved. However, the use of a metal-insulator-metal capacitor has proven to be particularly advantageous. Corresponding MIM capacitors offer the advantage of a low internal resistance and a low parasitic inductance, which thus essentially form an ideal plate capacitor. However, a combination of all above-mentioned types of capacitors, and also, if available, further capacitors individually or in combination can preferably also be used. It is particularly preferable in this case if the structural space available on the integrated laser driver circuit can be utilized as effectively as possible. The capacitance per unit of length can additionally be increased by the combination of various types of capacitances.

Furthermore, it is advantageous if, in the case of a metal-insulator-metal capacitor, at least one electrode of the capacitor is formed by a metal surface provided in the sub-switching unit. It is particularly preferable if both electrodes of the capacitor are formed by metal surfaces provided in the sub-switching unit. A metal surface can be, for example a conductor track or the like. During the production process, an insulator layer and, if only one metal surface is provided, a counter electrode can then be applied on the provided metal surfaces. In this manner, structures already provided in the sub-switching unit can be used multiple times, whereby the structural size of the integrated laser driver circuit may be further reduced.

According to a further design, it is provided that each sub-switching unit includes a current source, in particular a transistor, which is switchable via the switch, for generating the partial current. The current source is preferably formed as a field effect transistor. The current source and the switch can be connected in series to one another. The current source is particularly preferably approximately designed as a constant current source, which can generate a constant partial current and which can be switched via the switch to generate a pulsed partial current.

In this context, it is advantageous if each sub-switching unit includes a reference input, which is connected to the current source, for setting the partial current. The reference inputs of the individual sub-switching units can preferably be interconnected on the substrate in this case. A reference voltage can be applied to the reference input, for example via a DC voltage source. The partial current represents a function of the reference voltage in this case, because of which the pulse current of the laser diode also represents a function of the reference voltage. The reference voltage can be supplied via the reference input to the gate terminal of the transistor functioning as a current source. In addition, an impedance and/or an active circuit can be provided between the reference input and the current source to set the operating point. In this manner, the operating point of the current source of each sub-switching unit and thus the level of the partial current can be set.

It is particularly preferable if the current source and the switch form a partial current generating unit. The partial current generating unit can provide a partial current which can be set in its level in dependence on the total pulse current. In particular, the pulsing can also be set. The partial currents of the individual partial current generating units of the respective sub-switching units can be added, so that a defined total pulse current then results. It is particularly preferable if the partial current generating units are activated and/or set in such a way that they also apply the same partial current. A uniform switching behavior can be achieved in this way.

Furthermore, at least one synchronization unit for synchronizing the input and output signals, which is connected in parallel to the sub-switching units, is advantageous. With the aid of such a synchronization unit, delays induced by the switching itself, including possible changes due to temperature influences, aging, or the like, between the input signal and the resulting output signal can be ascertained and analyzed accordingly. In this manner, a synchronization signal may be generated, by means of which parasitic effects can be avoided, and which is simultaneously available to the output current of the laser driver. In this manner, complex synchronization processes can be avoided. The synchronization of the signals can be derived directly from the integrated laser driver circuit.

It is advantageous in this context if the synchronization unit has the same time behavior as the sub-switching units. In this manner, the time behavior of the sub-switching units and in particular delays arising in the sub-switching units can be ascertained in a simple manner and thus taken into consideration. In particular, a temperature independence of the integrated laser driver circuit can thus also be implemented.

According to one preferred design, it is provided that the synchronization unit and the sub-switching units are designed substantially identically with respect to the generation of the partial current. In particular, it has proven to be advantageous if the synchronization unit also includes a partial current generating unit, which includes the same elements as the partial current generating units of the sub-switching units. All additional elements, such as impedances, active circuits, or the like, can preferably also be provided in an identical manner. The synchronization unit can essentially differ from the sub-switching units in this case in that its output is not brought together with the output signals of the sub-switching units, but rather is led out separately as a synchronization output. In this manner, an electrical signal can be generated which corresponds with respect to the time behavior to that of the sub-switching units. However, this can then be used for a synchronization procedure and not for generating the pulse current.

A further design of the disclosure provides that the synchronization unit includes at least two partial current generating units each having an output, which switch in parallel or antiparallel. It is particularly advantageous in this case if the switching elements provided in the partial current generating units are essentially halved in relation to the partial current generating units of the sub-switching units. In this case, by way of doubling half elements, the same time and switching behavior can result as with a single element. As a result of the interconnection, an electrical behavior can also be implemented here which is essentially identical to that of the sub-switching units. However, the advantage that the signals can be used differentially is offered by the provision of two partial current generating units, which switch in antiparallel. This offers advantages in particular in a circuitry aspect.

In one refinement of the disclosure, it is proposed that the sub-switching units and/or the synchronization unit are activatable by means of a control circuit in such a way that all sub-switching units and/or the synchronization unit are switchable simultaneously. It is thus not necessary to control each sub-switching unit and/or the synchronization unit individually. Time delays and irregularities in the switching behavior can be prevented in this way. It is particularly preferable if a control signal is applied simultaneously to all input terminals of the sub-switching units and/or the synchronization unit. It can thus be ensured that the overall function of the integrated laser driver circuit is defined by an addition of equivalent individual functions without mutual influences or interferences. It is preferable if the control circuit is arranged on the substrate. In this manner, a compact construction and a rapid and precise activation of the sub-switching units and/or the synchronization unit can be achieved.

It is particularly advantageous in this context if the control circuit is designed as a binary amplifier tree structure. In this manner, the activation of the sub-switching units may be made even more precise. The simultaneity of the switching procedures can be further improved in this manner. The tree structure can preferably include delay and/or amplification elements in this case. By way of such a tree structure, a plurality of sub-switching units and/or the synchronization unit can be activated rapidly and efficiently using a single control signal.

A further design of the disclosure provides that the switching times of the sub-switching units and/or the synchronization unit are in the picosecond range. The switching times can be significantly shortened in relation to existing solutions by the design of the sub-switching units and/or the synchronization unit having an integrated energy accumulator. In this manner, even high currents in the ampere range can be switched rapidly. In particular, switching times in the sub-nanosecond range can be achieved using the integrated laser driver circuit. Furthermore, currents in the range of hundreds of milliamperes up to several amperes, preferably between 100 mA and 10 A, particularly preferably between 1 and 6 A, can be switched per sub-switching unit.

With the parallel connection of multiple sub-switching units, preferably more than 10 sub-switching units, in particular up to several hundred sub-switching units, laser drivers result in the range of several amps up to several hundred A having the switching behavior of the sub-switching units. The parallel connection of multiple sub-switching units having incorporated synchronization units within a row or a matrix, in particular also in multiple rows or in multiple blocks on a single semiconductor substrate is furthermore advantageous, from which multichannel lasers, in particular laser bars or multichannel VCSEL or VeCSEL can be activated. This is advantageous in particular for applications, for example, in the LIDAR field, in time-of-flight applications, or the like.

It is furthermore advantageous if the circuit is designed as a high-side driver circuit or as a low-side driver circuit. In a design as a low-side driver circuit, the load, in particular the cathode of a laser diode is switched to ground by means of the switch. In contrast, in a high-side driver circuit, the switch switches the load, in particular the anode of a laser diode, to the supply voltage. The design as a low-side driver circuit offers the advantage that the control circuit can be designed more simply than is the case, for example, in a high-side driver circuit. However, multichannel lasers are often embodied having common cathode and then require the design as a high-side driver circuit.

A design which is advantageous in this context provides that the energy accumulator in a high-side driver circuit is designed as a bootstrap capacitor. A low-inductance and low-resistance buffering of the energy demand for a switching procedure can be provided by means of the bootstrap capacitor.

In a laser system of the type mentioned at the outset, the object is achieved in that the integrated laser driver circuit is designed according to one of the above-described exemplary embodiments. The same advantages result as have already been explained in conjunction with the integrated laser driver circuit. All features can be applied alone or in combination in this case.

One advantageous design of the laser system provides that the laser diode is arranged on the integrated circuit. The overall structural height can be further reduced in this manner. A circuit which is closed per se results on a substrate. The complete laser system can thus be implemented as one component.

It is furthermore preferable if the integrated laser driver circuit is arranged on a substrate and the laser diode is connected in a thermally-conductive manner via stacked vias to the substrate. In this manner, very high currents in the ampere range can also be implemented, without problems because of overheating being able to occur. The heat can be dissipated in this manner.

It is furthermore advantageous if a laser pulse can be generated by two input signals, which are phase-shifted in particular. In this manner, a higher flank steepness and thus shorter switching times can be implemented. A faster switching and more precise activation is provided for the laser diode.

All of the features described above in conjunction with the laser system can also be applied alone or in combination in the integrated laser driver circuit. The same advantages also result here which were described in conjunction with the laser system.

BRIEF DESCRIPTION OF THE DRAWINGS

Further details of the disclosure are to be explained in greater detail hereafter on the basis of the exemplary embodiments illustrated in the accompanying drawings.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DESCRIPTION

Figure 1:
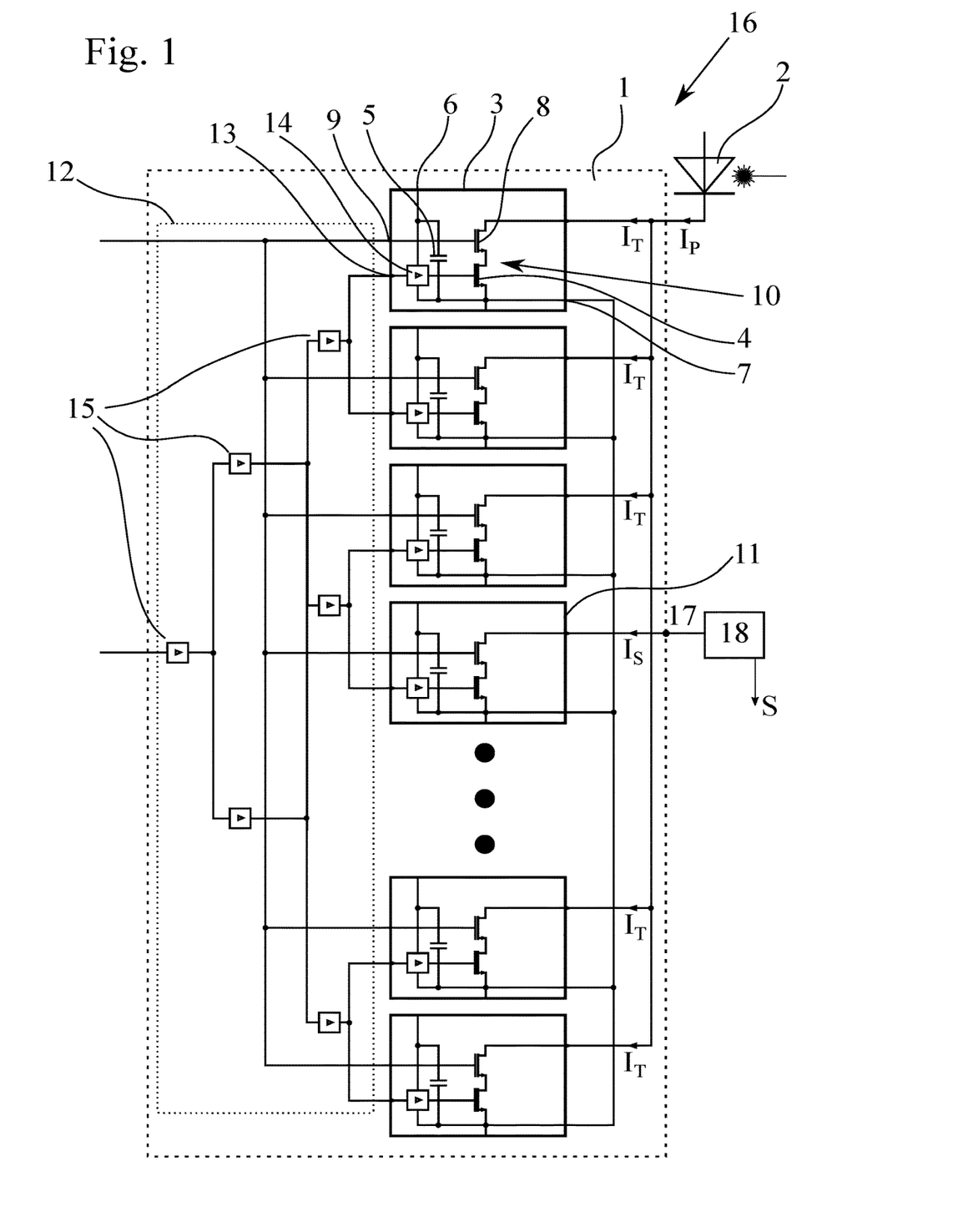
FIG. 1 shows an equivalent circuit diagram of an integrated laser driver circuit having multiple sub-switching units and a laser diode.

FIG. 1 schematically shows an equivalent circuit diagram of an integrated laser driver circuit 1 according to the disclosure, which is used for switching a pulse current $I_P$ for a laser diode 2. Such integrated laser driver circuits 1 can be applied in many fields of technology for switching a laser diode 2. Thus, for example, applications are known in the field of safety technology but also, for example, in vehicle technology in the field of LIDAR sensors or the like.

The integrated laser driver circuit 1 consists of a plurality of sub-switching units 3, which are each designed to generate a partial current $I_T$. Five sub-switching units 3, which are connected in parallel to one another, are shown solely by way of example in FIG. 1. However, the disclosure is not restricted thereto. Thus, for example, designs are also conceivable in which 100, 1000, or an arbitrary other number of sub-switching units 3 are used. Due to the integration of a plurality of substantially identical sub-switching units 3, which are each fully functional per se, adjacent to one another on a common semiconductor substrate, it is possible in a simple manner to optimize a laser driver circuit 1. In this case, the sub-switching units 3 are interconnected in such a way that the individual functions which the sub-switching units 3 each carry out are preferably obtained added in the effect thereof, while the driver currents are added together. As a result, the integrated laser driver circuit 1 then has the same parametric properties, for example speed, pulse form, voltage dependence, temperature response, as a single sub-switching unit 3. As a result, it is sufficient to improve the individual sub-switching units 3 to thus implement an optimized overall circuit 1.

As FIG. 1 furthermore shows, the sub-switching units 3 each have the same circuitry structure. In particular, the sub-switching units 3 contain the same passive and active components. The sub-switching units 3 are also designed identically with respect to the function and layout thereof. The individual sub-switching circuits 3 of the laser driver circuit 1 are arranged according to the present exemplary embodiment in columns on a semiconductor substrate (not shown in greater detail). However, the disclosure is not restricted thereto. Rather, it is possible to adapt the layout as needed, so that an optimized overall design can be implemented.

Figure 2:
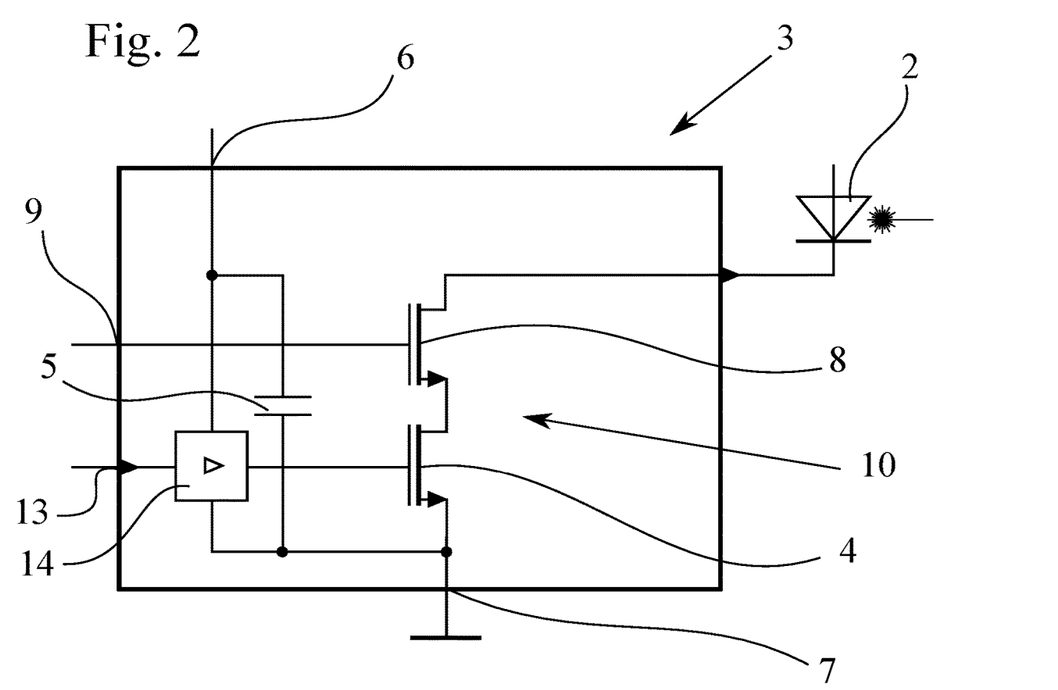
FIG. 2 shows an equivalent circuit diagram of a first exemplary embodiment of a sub-switching unit.

The structure and the functionality of a first exemplary embodiment of a sub-switching unit 3 is to be explained in greater detail hereafter on the basis of the illustration in FIG. 2.

According to the first exemplary embodiment, the sub-switching unit 3 includes a partial current generating unit 10, which includes at least one current source 8 and a switch 4. The partial current $I_T$ is generated by means of the current source 8. The current source 8 is designed in the present case as a transistor, which can be controlled via a reference input 9. A reference voltage can be applied at the reference input 9, for example, via a DC voltage source, which is used to set the operating point and to set the partial current $I_T$. The current source 8 is switched via a switch 4 connected in series to the current source 8 and in particular the partial current $I_T$ is pulsed by means of the switch 4. The switch 4 is also designed as a transistor and is connected via an electronic circuit 14 (e.g., an activation element), which can contain an amplifier, a pulse former, a signal processing unit, and/or an activation electronics unit, to a control input 13 of the sub-switching unit 3.

Figure 3:
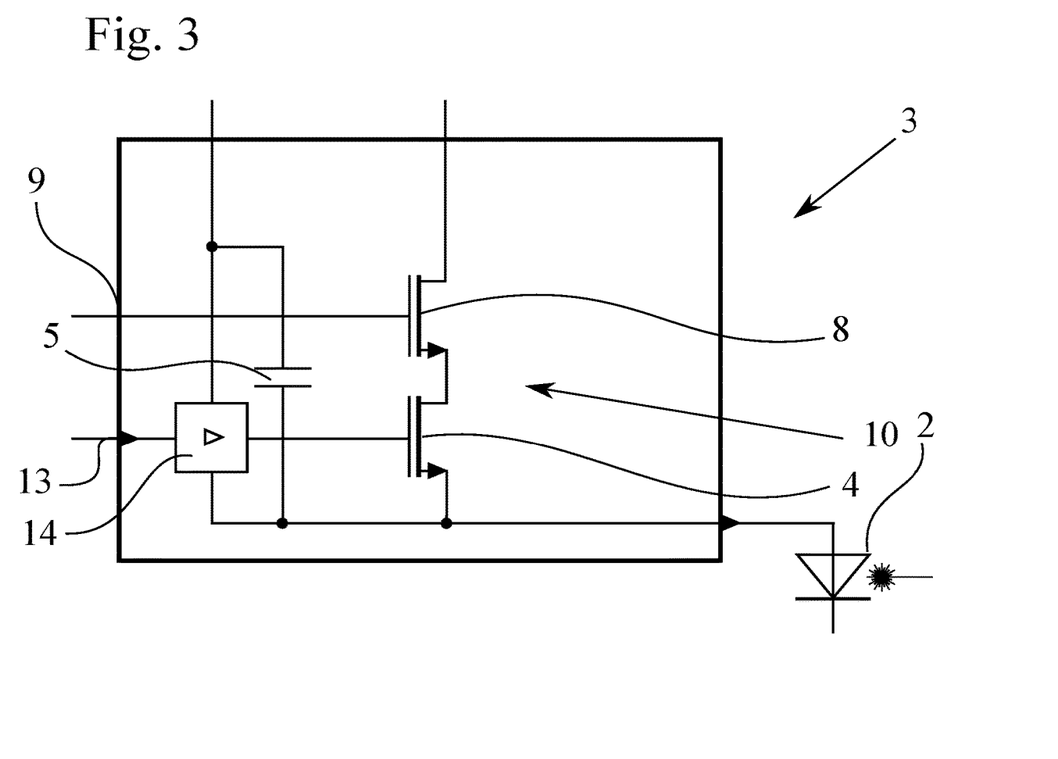
FIG. 3 shows an equivalent circuit diagram of a second exemplary embodiment of a sub-switching unit as a high-side driver.

The sub-switching unit 3 shown in FIG. 2 is designed as a low-side driver circuit, which means that the load is switched to ground. Such a laser driver circuit offers advantages in particular with respect to the activation and the pulse behavior. However, designs of a laser driver circuit 1 are also conceivable in which the sub-switching unit 3 is designed as a high-side driver circuit. FIG. 3 shows such an exemplary embodiment. In this case, the load is switched to the supply voltage.

To activate the individual sub-switching units 3, a control signal can be applied via a control circuit 12 at the control inputs 13. The control circuit 12, which can also be arranged on the substrate of the integrated laser driver circuit 1, is designed in the present case in such a way that the partial current generating units 10 of the sub-switching units 3 are each activated simultaneously. The control signal can be provided in different ways in this case. According to the present exemplary embodiment, the control circuit 12 is designed as a binary amplifier tree structure having multiple amplifier elements 15, which branches again and again in the direction of the sub-switching units 3. A corresponding dimensioning of the amplifier elements 15 within the tree structure has the result that the externally provided control signal is amplified and possibly delayed, but is applied simultaneously at the inputs 13 of the sub-switching units 3. In this manner, the control of the sub-switching units 3 may be made more precise and a simultaneous switching procedure of all sub-switching units 3 can be ensured, so that all switching units 3 can be activated rapidly and efficiently using a single control signal. In particular, a laser pulse can be generated by two input signals, which are phase-shifted in particular.

To now also be able to switch high currents in the ampere range within ultrashort switching times, preferably in the picosecond range, it is provided in the present disclosure that in each case an energy accumulator 5 for providing the switching energy required for switching the switch 4 is integrated into the sub-switching units 3. The switching energy required for switching the switch 4 can thus be kept ready in the individual sub-switching units 3, so that the switching energy required for the switching procedure is provided directly via the electronic circuit 14, which in particular is an amplifier or includes an amplifier. In this manner, a collapse of the supply voltage of the electronic circuit 14 can be prevented and this voltage can thus be stabilized. The energy accumulator 5 can then act as a voltage and/or energy source in the event of a high current or power demand, as occurs during the switching procedure. In addition, mutual influencing of the individual sub-switching units 3 is prevented, whereby pulses having high flank steepness may be generated.

The energy accumulator 5 is connected in this case in each sub-switching unit 3 between the supply terminal 6 for applying a supply voltage and the ground terminal 7 of each sub-switching unit 3. In this manner, the switching energy required for switching the switch 4 can be provided at the gate of the transistor in such a way that it can be ensured that the supply voltage of the electronic circuit 14 (e.g., activation element) applied at the supply terminal 6 does not collapse at the switching moment. By interconnecting the energy accumulator 5 between the supply terminal 6 and the ground terminal 7, this supply voltage can be locally stabilized, in particular during the switching procedure. The energy accumulator 5 is connected in parallel to the supply voltage, so that the energy accumulator 5 can act as a local supporting voltage and/or energy source. Current spikes can be reliably balanced out in this manner and the switching energy required for changing over the switch 4 can be provided.

In the present exemplary embodiment of the laser driver circuit 1, the energy accumulator 5 is designed as a capacitor and in particular as a backup capacitor having low impedance at high frequencies. Additional interfering time-limited overvoltages are thus absorbed and the propagation and harmful effects thereof are thus reduced. The energy accumulator 5 has a capacitance in the nanofarad or in the picofarad range, but particularly preferably in the picofarad range. To avoid parasitic effects, the energy accumulator 5 is connected via a short and low-inductance connector. The energy accumulator 5 is connected in a low-inductance manner by lines which are correspondingly formed short and/or by cross sections of the conductor tracks which are selected to be large. Due to the spatial proximity to the switch 4, high inductances are avoided, because of which current can be supplied immediately in the case of current spikes and voltage drops are thus kept within limits. Simultaneously, the high currents can only flow on the short path, so that the EMC interferences thus induced can be strongly damped. Instabilities and a variation of the integrated laser driver circuit 1 can be prevented in this way. In the case of a high-side driver circuit 1, the energy accumulator 5 can be used as a bootstrap capacitor.

It is advantageous if the energy accumulator 5 is designed as a metal-insulator-metal (MIM) capacitor, fringe capacitor, poly-poly capacitor, as a diffusion capacitor, and/or as a gate capacitor. However, it is particularly advantageous for a combination of the various capacitor types to be used depending on the layout design. According to the present exemplary embodiment, the energy accumulator 5 is designed as a metal-insulator-metal energy accumulator 5. In this case, at least one electrode of the energy accumulator 5 is at least formed by a metal surface provided in the sub-switching unit 3, for example, a conductor track or the like. In the scope of the manufacturing process, an insulator layer and if needed a further counter electrode is applied to this metal surface. If provided metal surfaces are used for both electrodes of the energy accumulator 5, the insulator layer is thus arranged between these two metal surfaces. In this manner, a space-saving arrangement may be produced with high capacitance at the same time. The capacitors 5 preferably have a high capacitance per unit of length, whereby the capacitance per unit of length can additionally be increased by the combination of the individual capacitor types.

Since the sub-switching units 3 have certain parasitic effects because of the components thereof, for example delays or a temperature-dependent behavior, a delay, which has proven to be disadvantageous, can result in the laser driver circuit 1. To be able to detect and eliminate these parasitic effects, in addition to the sub-switching units 3, a synchronization unit 11 is provided for synchronizing the input and output signals, as is furthermore shown in FIG. 1.

The synchronization unit 11 is essentially identical to the sub-switching units 3. According to the exemplary embodiment illustrated in FIG. 1, the synchronization unit 11 has identical electrical temperature and/or time behavior to the sub-switching units 3, in particular because identical components are provided here. In particular, the same partial current generating unit 10 is also provided in the synchronization unit 11 as in the sub-switching units 3.

In contrast to the outputs of the sub-switching units 3, the output 17 of the synchronization unit 11, via which the synchronization current $I_S$ is conducted, is not brought together with the other outputs of the sub-switching units 3, however, but rather is led outward separately as a sync output 17, in particular to a separate synchronization circuit 18. In this manner, a synchronization signal S may be generated, in particular by means of the synchronization circuit 18, which can be used for synchronization with the summed driver current $I_P$ or with the light pulse generated using the laser diode 2. The summed driver current $I_P$ has the same time behavior as the partial currents $I_T$ of the sub-switching units 3 and/or as the synchronization current $I_S$ of the synchronization unit 11. The defined electrical switching point in time of the laser diode 2 can thus be output via the sync output 17 and/or using the synchronization signal S. If the electro-optical conversion time of the laser diode 2 is known, the precise light emission point in time of the laser diode 2 is also known and can be taken into consideration in the synchronization signal S. For example, in case of a LIDAR system, the synchronization current $I_S$ can be used for a synchronization of a sensor receiving the laser light as the foundation for the accurate time-of-flight measurement. An otherwise cumbersome and complicated synchronization method can thus be omitted.

Instead of a structure of the synchronization unit 11 which is identical with respect to the components used, designs are also conceivable in which the elements provided in the partial current generating units 10 are doubled and are halved in the size thereof. In this case, preferably two partial current generating units 10 are then provided within the synchronization unit 11. The elements thus doubled can then be connected in parallel or antiparallel to one another. In this way, in particular a differential output signal can be generated. Additional signals may be generated in this way, which are advantageous in particular for the circuitry postprocessing. Nonetheless, the synchronization unit 11 has the same time behavior as the sub-switching units 3, however.

The integrated laser driver circuit 1 can form a laser system 16 together with the laser diode 2. It is advantageous in this case if the laser diode 2 is arranged on the integrated laser driver circuit 1 as the substrate. In this manner, the structural size can be further reduced. In such a laser system 16, the integrated laser driver circuit 1 can form the substrate, wherein the laser diode is connected in a thermally-conductive manner via stacked vias to the substrate. In particular a direct metallic connection to the substrate can exist in this case for the heat dissipation between the laser diode 2 and the driver circuit 1. The output terminals and the ground terminals of all sub-switching units 3 are interconnected on the substrate. The interconnected output terminals are connected to the cathode of the laser diode 2, the anode of which is in turn connected to a supply source which supplies an operating voltage in relation to ground.

Using an integrated laser driver circuit 1 according to the disclosure, which includes a plurality of essentially identically designed sub-switching units 3, a scalable high-speed current driver circuit for a laser diode 2 can be constructed in a simple manner. The sub-switching units 3 can each be designed optimally for a small partial current $I_T$, which are added to form a pulse current $I_P$, so that as a result the overall circuit 1 is also optimized for a high current $I_P$ of several amperes up to several hundred amperes. Due to the provision of an energy accumulator 5 within each sub-switching unit 3, the switching energy required for the switching of the switch 4 can be provided in particular for one or more pulses and a collapse of the local supply voltage can thus be prevented. In this manner, extremely rapid switching times having high flank steepness may be implemented.

Numerous specific details are set forth herein to provide a thorough understanding of the claimed subject matter. However, those skilled in the art will understand that the claimed subject matter may be practiced without these specific details. In other instances, methods apparatuses, or systems that would be known by one of ordinary skill have not been described in detail so as not to obscure claimed subject matter.

Unless specifically stated otherwise, it is appreciated that throughout this specification discussions utilizing the terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The system or systems discussed herein are not limited to any particular hardware architecture or configuration. A computing device can include any suitable arrangement of components that provides a result conditioned on one or more inputs. Suitable computing devices include multipurpose microprocessor-based computer systems accessing stored software that programs or configures the computing system from a general purpose computing apparatus to a specialized computing apparatus implementing one or more implementations of the present subject matter. Any suitable programming, scripting, or other type of language or combinations of languages may be used to implement the teachings contained herein in software to be used in programming or configuring a computing device.

Implementations of the methods disclosed herein may be performed in the operation of such computing devices. The order of the blocks presented in the examples above can be varied for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or value beyond those recited. Headings, lists, and numbering included herein are for ease of explanation only and are not meant to be limiting.

It will also be understood that, although the terms "first," "second," etc. may be used herein to describe various elements, these elements should not be limited by these terms. These terms are only used to distinguish one element from another. For example, a first node could be termed a second node, and, similarly, a second node could be termed a first node, which changing the meaning of the description, so long as all occurrences of the "first node" are renamed consistently and all occurrences of the "second node" are renamed consistently. The first node and the second node are both nodes, but they are not the same node.

The terminology used herein is for the purpose of describing particular implementations only and is not intended to be limiting of the claims. As used in the description of the implementations and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description and summary of the disclosure are to be understood as being in every respect illustrative and exemplary, but not restrictive, and the scope of the disclosure disclosed herein is not to be determined only from the detailed description of illustrative implementations but according to the full breadth permitted by patent laws. It is to be understood that the implementations shown and described herein are only illustrative of the principles of the present disclosure and that various modification may be implemented by those skilled in the art without departing from the scope and spirit of the disclosure.

LIST OF REFERENCE SIGNS 1 integrated laser driver circuit
2 laser diode
3 sub-switching unit
4 switch
5 energy accumulator
6 supply terminal
7 ground terminal
8 current source
9 reference input
10 partial current generating unit
11 synchronization unit
12 control circuit
13 control input
14 activation element
15 amplifier element
16 laser system
17 sync output
18 synchronization circuit
$I_P$ pulse current
$I_T$ partial current
S synchronization signal

The invention claimed is:

1. An integrated laser driver circuit for switching a pulse current ($I_P$) for a laser diode, the integrated laser driver circuit comprising:
   a plurality of sub-switching units, each generating a partial current ($I_T$) and including a switch that pulses the partial current ($I_T$), wherein the sub-switching units of the plurality of sub-switching units are connected to one another in parallel for generating a pulse current ($I_P$); and
   an energy accumulator integrated into each of the sub-switching units to provide switching energy required for switching the switch, wherein each sub-switching unit comprises a local supply terminal for applying a supply voltage and a local ground terminal, wherein the energy accumulator is connected between the supply terminal and the ground terminal, and wherein the energy accumulator is a capacitor wherein each sub-switching unit comprises a current source in the form of a transistor, which is switchable via the switch, for generating the partial current ($I_T$) and wherein each sub-switching unit comprises a reference input connected to the current source for setting the partial current ($I_T$).

2. The integrated laser driver circuit of claim 1, wherein the capacitor is selected from a metal-insulator-metal capacitor, a fringe capacitor, a poly-poly capacitor, a diffusion capacitor, and a gate capacitor.

3. The integrated laser driver circuit of claim 1, wherein the capacitor comprises a metal-insulator-metal capacitor, and wherein at least one electrode of the capacitor is formed by a metal surface provided in the sub-switching unit.

4. The integrated laser driver circuit of claim 1, wherein the current source and the switch form a partial current generating unit.

5. The integrated laser driver circuit of claim 1, further comprising a synchronization unit connected in parallel to the plurality of sub-switching units, the synchronization unit configured to synchronize input and output signals.

6. The integrated laser driver circuit of claim 5, wherein the synchronization unit comprises a same time behavior as the plurality of sub-switching units.

7. The integrated laser driver circuit of claim 5, wherein the synchronization unit and the plurality of sub-switching units are substantially identical with respect to the generation of the partial current ($I_T$).

8. The integrated laser driver circuit of claim 5, wherein the synchronization unit comprises at least two partial current generating units, wherein each partial current generating unit comprises an output configured to switch in parallel or antiparallel.

9. The integrated laser driver circuit of claim 5, further comprising a control circuit that switches the plurality of the sub-switching units and the synchronization unit simultaneously.

10. The integrated laser driver circuit of claim 9, wherein the control circuit comprises a binary amplifier tree structure.

11. The integrated laser driver circuit of claim 9, wherein switching times of the plurality of sub-switching units and the synchronization unit are in a picosecond range.

12. The integrated laser driver circuit of claim 1, wherein the integrated laser driver circuit comprises a high-side driver circuit or as a low-side driver circuit.

13. The integrated laser driver circuit as claimed in claim 1, wherein the integrated laser driver circuit comprises a high-side driver circuit that includes the energy accumulator, wherein the energy accumulator comprises a bootstrap capacitor.

14. A laser system comprising a laser diode and the integrated laser driver circuit of claim 1.

15. The laser system of claim 14, wherein the laser diode is arranged on the integrated laser driver circuit.

16. The laser system of claim 14, wherein the integrated laser driver circuit comprises a substrate, wherein the laser diode is connected in a thermally-conductive manner via stacked vias to the substrate.

17. The laser system of claim 14, further comprising a laser pulse generated by two phase-shifted input signals.

* * * * *